United States Patent [19]
Olson

[11] Patent Number: 5,766,740
[45] Date of Patent: Jun. 16, 1998

[54] ADHERENT FILM WITH LOW THERMAL IMPEDANCE AND HIGH ELECTRICAL IMPEDANCE USED IN AN ELECTRONIC ASSEMBLY WITH A HEAT SINK

[75] Inventor: Bruce David Olson, Northfield, Minn.

[73] Assignee: Sheldahl, Inc., Northfield, Minn.

[21] Appl. No.: 743,661

[22] Filed: Nov. 5, 1996

Related U.S. Application Data

[63] Continuation of Ser. No. 451,128, May 26, 1995, abandoned.

[51] Int. Cl.$^6$ .............................. B32B 7/00; H05K 1/02
[52] U.S. Cl. .................... 428/209; 428/213; 428/215; 428/325; 428/328; 428/330; 428/331; 428/332; 428/413; 428/473.5; 428/480; 428/483; 428/901; 174/138 G; 361/704; 361/707; 438/118; 438/119
[58] Field of Search .................... 428/323, 209, 428/210, 901, 213, 215, 325, 328, 329, 330, 331, 332, 413, 473.5, 480, 483; 361/704, 705, 706, 707, 708, 709; 437/211; 174/138 G; 438/118, 119

[56] References Cited

U.S. PATENT DOCUMENTS

| | | |
|---|---|---|
| 4,297,474 | 10/1981 | Williams, III et al. ............... 528/170 |
| 4,574,879 | 3/1986 | DeGree et al. ....................... 165/185 |
| 4,810,563 | 3/1989 | DeGree et al. ....................... 428/209 |
| 4,849,857 | 7/1989 | Butt et al. ........................... 361/388 |
| 4,858,073 | 8/1989 | Gregory ............................. 361/388 |
| 4,866,108 | 9/1989 | Vachon et al. ....................... 523/428 |
| 4,869,954 | 9/1989 | Squitieri ............................. 428/283 |
| 4,914,551 | 4/1990 | Anschel et al. ...................... 361/389 |
| 5,014,159 | 5/1991 | Butt ................................... 361/386 |
| 5,175,613 | 12/1992 | Barker, III et al. .................. 257/713 |
| 5,285,108 | 2/1994 | Hastings ............................. 257/712 |
| 5,372,883 | 12/1994 | Shores ............................... 428/323 |
| 5,448,105 | 9/1995 | Katoh et al. ........................ 257/666 |
| 5,471,027 | 11/1995 | Call et al. .......................... 219/85.13 |
| 5,510,174 | 4/1996 | Litman .............................. 428/261 |

OTHER PUBLICATIONS

24th ISATA, Florence, Italy, 20–24th May, 1991, Y. Belopolsky: "Evaluation of Power Transistor Mounting fpr Automotive Electronics Based on Planar Heat XP000308596 Spreading", pp. 37–44 see figure 2; table 1.

Advanced Packaging, vol. 4, No. 4, Jun. 1995–Aug. 1995, Ishing Group US, p. 16 XP000532820 "Insulating Tape" see the whole document.

Patent Abstracts of Japan, vol. 7, No. 140 (E–182), 18 Jun. 1983 & JP,A,58 052859 (Hitachi), 29 Mar. 1983, see abstract.

Patent Abstracts of Japan, vol. 9, No. 325 (E–368), 20 Dec. 1985 & JP,A,60 157244 (Denki Kagaku Kogyo), 17 Aug. 1985, see abstract.

Patent Abstracts of Japan, vol. 5, No. 103 (E–64), 3 Jul. 1981 & JP,A,56 045060 (Hitachi), 24 Apr. 1981, see abstract.

*Primary Examiner*—Marie Yamnitzky
*Attorney, Agent, or Firm*—Merchant, Gould, Smith, Edell, Welter & Schmidt, P.A.

[57] ABSTRACT

An electronic assembly containing an active circuit, an insulating layer and a heat sink. The insulating layer comprises an unfilled thermoplastic sheet having adhesive layers on opposite sides of the sheet. The adhesives are filled with thermally conductive material while the film is unfilled. The properties of the insulating layer are such that the thermal impedance is low while dielectric strength is high. These improved films reduce costs, improve thermal and electrical properties. The layers of the invention are particularly useful for single or multiple layer printed circuit boards having surface mount components in conjunction with a sheet like aluminum heat sink.

47 Claims, 1 Drawing Sheet

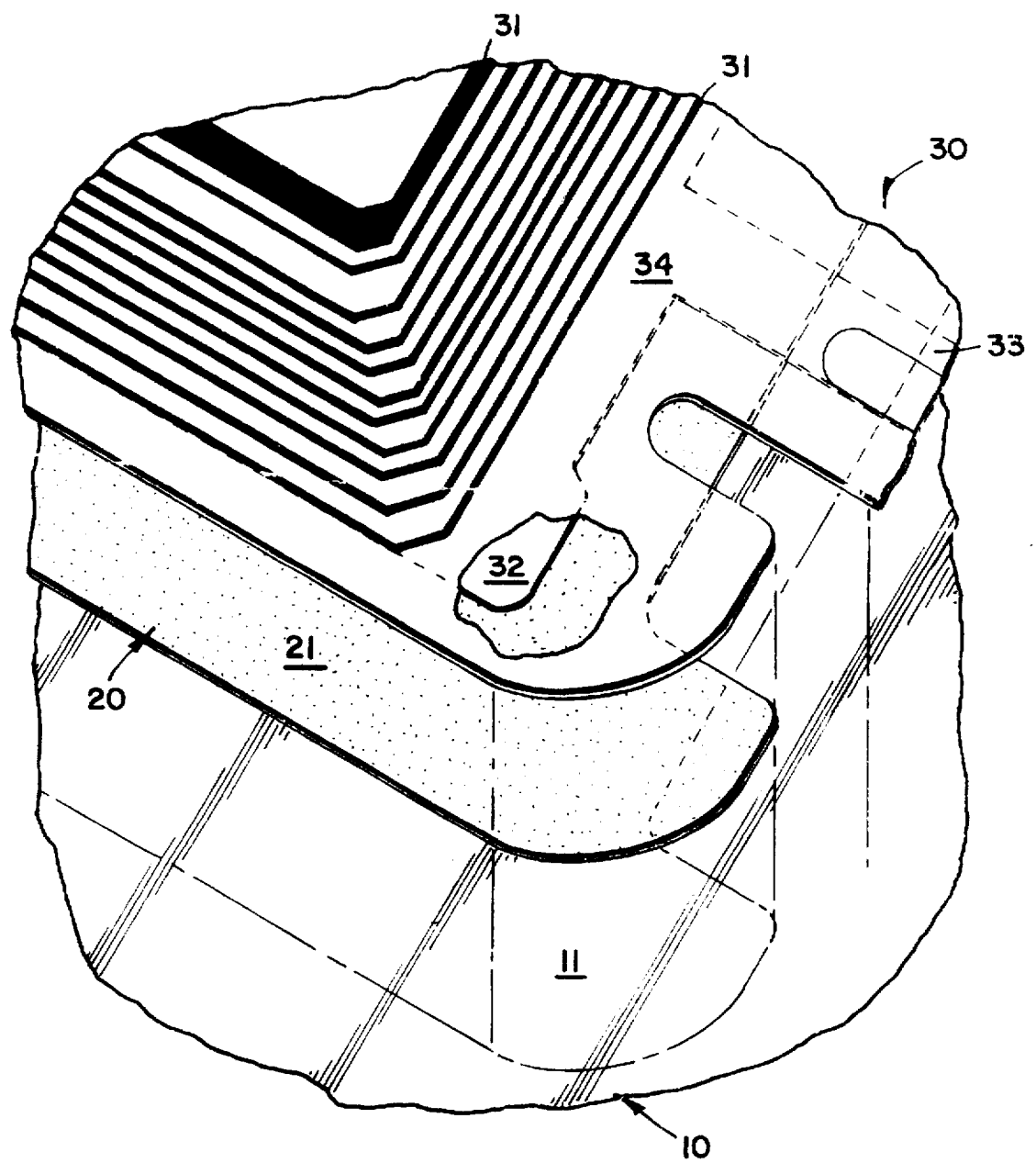

ADHERENT FILM WITH LOW THERMAL IMPEDANCE AND HIGH ELECTRICAL IMPEDANCE USED IN AN ELECTRONIC ASSEMBLY WITH A HEAT SINK

This is a Continuation of application Ser. No. 08/451, 128, filed May 26, 1995 (now abandoned) which application is incorporated herein by reference.

FIELD OF THE INVENTION

The invention relates to an electronic circuit comprising a circuit pathway or trace made on a rigid or flexible printed circuit board substrate and an electronic assembly which uses the circuit in thermal communication with, but electrically insulated from a heat sink. The invention additionally relates to an electronic circuit assembly that uses a rigid or flexible substrate, an electrical insulation layer and a heat sink.

BACKGROUND OF THE INVENTION

Electronic assemblies that include a circuit trace or pattern on a rigid or flexible printed circuit board, are known. Because heat is generated during the electrical operation of many such assemblies, a need exists for the effective removal and dissipation of heat. If the heat is not removed, circuit operation can be impaired or one or more parts of the assembly may be damaged or destroyed. A well known means for providing heat removal is the use of a heat sink, having substantial heat capacity and heat dissipation properties, as a part of the assembly. Heat flows from the active circuit into the heat sink and away from the source of heat. The heat sink operates through a large heat capacity and by heat dissipation through conduction, convection, radiation or a combination of these effects. The presence of a circuit pathway or circuit trace, on the flexible circuit, in contact with a conductive heat sink requires an electrically insulating layer between any active circuit path and any metallic portion of the heat sink. Ideally, the insulating layer comprises a material that has a maximized thermal conductivity (minimum thermal impedance) with optimized electrical insulation (high dielectric strength). Because close contact between the circuit and the heat sink improves heat dissipation, a material that is both thermally conductive and electrically insulating is particularly desirable. Further, heat flow is optimized if the insulation is as thin as possible without losing electrical isolation.

The prior art describes a large variety of thermal dissipating schemes for cooling many types of heat generating devices. Gregory, U.S. Pat. No. 4,858,073 describes a metal surface and a thermally laminated insulator film having a conductive foil layer. An active semiconductor device is attached to a heat conductor that is in contact with the foil layer to remove heat from the semiconductor. Heat flows from the semiconductor through the heat conductor into the foil to be dissipated. Butt, U.S. Pat. Nos. 4,849,857 and 5,014,159 describes a semiconductor package having a semiconductor chip bonded to an (e.g.,) copper core heat sink with refractory materials. The copper core can be further attached to a metallic heat sink. The semiconductor chip is wire bonded to the active printed circuit pattern. The package then is integrated into the active circuit using conventional components. Barker, III et al., U.S. Pat. No. 5,175,613 describes a thermally conductive elastomer that is placed between the circuit and the heat sink. Mechanical devices are employed to compress the elastomer and maintain contact between the components of the package. No adhesive material is used to bond the chip to the heat sink. No detail is provided regarding the nature of the thermally conductive elastomer. DeGree et al., U.S. Pat. No. 4,574,879 teaches a thermally conductive mounting pad for a solid state device such as a power transistor, SCR or triac. The mounting pad comprises at least a three-layer laminate. The laminate comprises, in a center layer, a filled polyimide (amide) containing a thermally conductive particulate such as aluminum oxide, boron nitride, etc. The two outside layers in the laminate comprise a silicone base rubber. DeGree et al., U.S. Pat. No. 4,810,563 teaches a thermally conductive laminate structure. The laminate can have up to five layers including two oppositely disposed outer metallic layers enclosing center composite layers. The center layers comprise films of polyimide (amide) filled with aluminum oxide, boron nitride or other suitable thermally conducting particulate. Squitieri, U.S. Pat. No. 4,869,954 discloses a thermally conductive laminate having at least three layers; the center layer comprising a conventional glass, fiberglass, plastic film and metal foil layer. The two oppositely disposed external layers form from a curable liquid urethane material containing thermally conductive particulate. The liquid urethane material is formed into a coating on the center layer, is cured to form solid laminate structure. Anschel et al., U.S. Pat. No. 4,914,551 teaches an electronic package adapted to cool a discrete electronic device such as a semiconductor (e.g., a silicon chip). The semiconductor device is positioned on a thin film substrate attached to a second substrate. A heat spreading surface is bonded to the semiconductor device surface and a heat sink is bonded to the heat spreading device. The heat spreading device is a bulk material such as silicon carbide, aluminum nitride, or copper clad material. An adhesive material is used to define a first interface between the semiconductor device and the heat spreader. The interface between the heat sink and the heat spreader is also insulated by a thermally conducted insulating adhesive. Hastings et al., U.S. Pat. No. 5,285,108 describe the use of a thermally conductive material that is also electrically insulating. The material comprises silicone or urethane elastomer that is filled with known thermally conducting fillers.

Improved techniques are needed for removing heat from printed circuits. Circuits that generate substantial heat need an insulating layer that can conduct substantial heat while maintaining substantial dielectric strength. As the electrical properties improve the thickness of the layer can often increase. Such thickness can result from higher amounts of fillers to increase thermal conductivity or from the use of thicker layers to achieve the required dielectric strength. These thick layers reduce the flexibility of the printed circuit, reduce thermal properties and additionally can increase the cost of the final product.

A need exists for a means of connecting a rigid or flexible printed circuit board to a heat sink that provides good electrical insulation, low thermal resistance and reduced assembly thickness.

SUMMARY OF THE INVENTION

The invention resides in an electrical assembly having at least one flexible or rigid circuit substrate having at least one copper circuit trace on each side of the substrate. The circuit is bonded to a heat sink to form the assembly. The active metal circuit pattern, trace or traces are disposed on a side of the circuit substrate bonded to the heat sink and are insulated from the heat sink using an interposed or intermediate adherent film. The film comprises an unfilled thin polymer film or sheet that separates the metallic circuit traces from the heat sink. The heat sink and circuit are bonded to the insulating film using a filled adhesive layer disposed on opposite sides of the unfilled insulating film layer. The filled adhesive comprises a thermoplastic or thermosetting, adhesive or pressure sensitive adhesive (PSA) formulation containing a thermally conductive particulate filler material. The particulate material in the adhesive on the heat sink side may also be electrically conductive. However, any particulate in contact with an active circuit is preferably not electrically conductive. The film of the insulating layer is substantially free of any thermally conductive filler. Preferred fillers are ceramic particulate. Using this combination of elements, a thermally conductive bond ply can be made having a thickness of less than 150 µm, preferably less than 135 µm can be used.

The rigid or flexible printed circuit board can be a circuit comprising a single hard board layer such as phenolic or epoxy, or a polymeric layer, having one or more circuit traces on opposite sides of the board or film or can be a multilayer film comprising two, three, four or more layers of circuitry bonded into a cooperating active circuit by interconnections between the layers. Metallic traces can also act to manage heat as thermal passageways or dissipation units. The heat sink can be a sheet of metallic material such as aluminum or copper. Alternatively, heat sinks having heat capacity and heat dissipation rates substantially greater than metallic sheets can also be used. Finned heat sinks or tabbed heat sinks or heat sinks having liquid coolant can be used.

One aspect of the instant invention provides an adherent film article having low thermal impedance and high dielectric strength that retains a high degree of flexibility. The adherent film can have multiple layers. For example, the adherent film assembly can comprise a first filled thermally conducting adhesive layer, an unfilled polymeric film having high dielectric strength, and a second filled thermally conducting adhesive layer. The adherent film assembly preferably has a maximum thermal impedance of 250° C.-mm$^2$/watt and a minimum dielectric strength of 400 V (ac). The first adhesive layer requires dielectric strength sufficient to prevent trace to trace shorting. The two adhesive layers of the film increase the thermal conductivity of the assembly by maintaining close contact between the active circuit and the heat sink. The layers provide useful electrical dielectric strength. The first and/or the second adhesive layer contain a thermally conductive material such as a ceramic particulate to increase the thermal conductivity of the layer. For the thin film layer an unfilled polymeric film is chosen having good dielectric strength. This film layer is as thin as possible to minimize thermal resistance while providing electrical insulation. Suitable materials for this layer include, for example, polyesters, polyetherimides, polyimides and other equivalent engineering resins. The adherent film assembly of the invention has a combination of physical, thermal, and electrical properties that are well suited for assembly processes (e.g., soldering) mounting printed circuits on to a heat sink or other heat dissipating devices.

Another aspect of the instant invention is an electronic assembly that comprises a printed circuit board attached to a heat sink by the adherent film article. In this electronic assembly the adherent film provides superior heat dissipation into the heat sink. Performance is not impaired by thermal stress, and the unfilled polymeric layer provides electrical insulation between the printed circuit and the heat sink.

A further aspect of the invention is a method of assembling the electronic package comprising bonding of an assembly made from a thin dielectric film and filled adhesive to the backside of a circuit, followed by bonding to a heat sink at least partly coated with a layer of thermally conductive adhesive.

BRIEF DESCRIPTION OF THE FIGURE

The FIGURE is a perspective of an exploded view of a double sided printed circuit board having exposed portions. The flexible printed circuit board can be adhered to the heat sink using an intermediate insulating layer.

DETAILED DESCRIPTION OF THE INVENTION

The electronic assemblies of the invention use a thin insulating polymer film disposed between an active circuit and a heat sink using a filled, thermally conductive adhesive. The film should be selected to minimize thermal impedance while maintaining adequate dielectric strength. Thermal impedance is reduced by reducing the thickness of the film. However, as the film thickness is reduced, the insulating value or dielectric strength is reduced. Below a certain thickness, the film cannot be relied upon for providing adequate electrical insulation. Preferred films have a maximum thickness of less than 15 µm, about 1 to 15 µm, preferably about 5 to 12 µm. Typically the dielectric strength of the layer must be at least 300 volts (ac) preferably at least 1000 volts (ac). The thermal properties of the film can be characterized with a thermal impedance (less than about 100° C.-mm$^2$/watt, preferably less than about 50° C.-mm$^2$/watt). Any film that corresponds to these dimensions and thermal and dielectric strength properties can be used as an insulating layer. Lastly the films are substantially unfilled. Commonly in this art, insulating films have been used containing a substantial portion of a thermally particulate filler material to improve the thermal conductivity. Such thermally conductive particulate typically comprise a ceramic material. The films of this invention are substantially free of any such filler material. The absence of filler permits the use of a film of thin film at low cost. A broad class of potential film materials are known. Preferred film materials include thermoplastic polyesters, polyimides, polyetherimides and equivalent engineering resins.

Preferred films are made from aromatic dicarboxylic acids and alkane diols. Preferred alkane diols and the polyesters include ethylene glycol, 1,4-butanediol, 1,6-hexanediol, 1,4-cyclohexanediol and other aliphatic diols having from 2–12 carbon atoms in a saturated linear or cyclic alkyl structure. Preferred aromatic acids in the manufacture of the polyesters of the invention include terephthalic acid (1,4 benzene dicarboxylic acid) terephthalic dicarboxylic acids, (e.g..), 2,6-naphthalene dicarboxylic acid, 2,7-naphthalene dicarboxylic acid, etc. The preferred polyester film composition of the invention is a poly (ethylene-co-2,6-naphthalene dicarboxylic) (PEN).

Polyimides are condensation polymers derived from bifunctional carboxylic anhydrides and primary amines. The imide structure —CO—NR—CO—, having a linear or heterocyclic unit along the polymer backbone, is characteristic. Aromatic heterocyclic polymers exhibit outstanding mechanical properties and excellent stability. Polyimides can be prepared from an aliphatic diamine and an aromatic tetracarboxylic acid in a multistep sequence in the melt reaction. An alternative preferred preparation from aromatic tetracarboxylic dianhydrides is more versatile. Aromatic diamines such as 1,4-phenylene diamine, 1,3-phenylene diamine, 4,4'-methylene diphenylene diamine, hexamethylene diamine, 4,4'-oxydianiline (ODA), etc. can be reacted with the dianhydride.

Polyetherimides are an engineering plastic well known in the art. The techniques used to produce polyetherimides are also well known. See, for example, U.S. Pat. No. 4,297,474. Typically in the practice of the manufacture of polyetherimides, a substituted aromatic bis-amide is reactive with an alkali metal phenate to form the polyether amide. The alkali metal phenate can be either monocyclic or polycyclic and can contain two phenate groups. The phenates are reacted with materials as described above containing the —O—phenylene—O— group. Alternatively the polyetherimide can be made by a conventional condensation of diamines and an ether containing dianhydride. Preferred polyetherimide resins are ULTEM® polyetherimide (PEI) resins manufactured by G.E. Plastics Company.

Insulating films discussed above commonly are coated with a thermally conductive adhesive layer before use. The adhesive layer is made thermally conductive using a minimum film thickness and a substantial proportion of the heat conductive filler material. Preferred fillers are metallic, inorganic or ceramic particulate that can be dispersed or suspended in the adhesive material prior to coating the polymer film. The particle size of the particulate typically ranges from about 0.1 to 30 microns, preferably 1.0 to 25 microns. Useful thermally conducting but electrically insulating ceramic materials include aluminum oxide, beryllium oxide, magnesium oxide, titanium oxides, zinc oxide, boron nitride, aluminum nitride, silicon nitride, silicon carbide, silica, diamond, etc. and mixtures thereof. The thermally conducting material within the adhesive layer, in contact with the heat sink can be the particulate above or the following Cu, Al, Ag, Au, Ni, Zn, Fe, Pd, Pb, Sn, solder, graphite, carbon, or mixtures thereof.

A variety of adhesive types can be used. Both thermoplastic or thermosetting adhesives are available. The preferred adhesive comprises a solvent borne or based, hot melt thermoplastic adhesive solvent borne, water borne, or hot melt thermoplastic adhesive. Solvent borne adhesive systems permit better dispersal of particulate filler and also improved consolidation of the filler matrix upon drying. Such systems are typically composed of soluble or dispersed acrylic epoxy, polyimide, polyester or polyurethane resins. Water borne adhesives can be used if compatible with filler. Thermoplastic hot melt adhesives typically comprise a thermoplastic polymer such as an ABA block copolymer (wherein A is polystyrene and B is a polybutadiene or polyisoprene), polyethylene, poly(ethylene-co-vinyl acetate), an acrylic resin, a polystyrene resin, or other known polymer, in combination with a tackifier, a plasticizer or extender. These materials are typically made by combining the materials in a melt condition, blending until uniformed and packaging the adhesives for transfer to point of use. Thermosetting adhesives operate by chemically crosslinking the composition between polymer backbone chains resulting in a highly cross-linked reaction product. The most common thermosetting adhesive types include epoxy adhesives and urethane adhesives. Typically the adhesives contain about 10 to 50 vol-%, preferably about 30 to 40 vol-% of the thermally conductive inorganic filler particulate. In manufacturing the insulating films of the invention, the film is typically coated on both sides of the film, with a layer of filled adhesive composition.

Typically, the thickness of the adhesive film is about 15 to 60 microns, preferably 25 to 40 microns. The thickness of the adhesive film is minimized to obtain adequate bonding while maximizing thermal conductivity. The thermal conductivity of the filled adhesive composition should range between about 0.5–20 watts/m-K, preferably greater than 1 watts/m-K. The adhesive film preferably has a maximum thermal impededance of 250° C.-mm$^2$/watt and a minimum dielectric strength of 400V (ac).

A major limiting factor for any electronic circuit consuming electric power is the high thermal resistance between the component and the ambient surroundings. To increase the heat handling capacity of any circuit, the circuit must be mounted in intimate thermal contact with a heat sink. A heat sink is simply a mechanical device with an improved heat transfer capability, i.e., heat transfer from the device into the ambient atmosphere. Heat sinks often consist of a metal chassis, a metal sheet, a finned structure with or without forced air cooling or even a liquid cooled metal structure for maximum heat transfer and minimum volume. The available shapes and sizes vary widely. The choice of a heat sink for a particular application depends on the net thermal resistance from the circuit to the ambient atmosphere in terms of required power dissipation. Preferred heat sinks in this application are thin metallic sheets, preferably aluminum having a thickness of about 0.020–0.0125 inches. For circuits having higher power dissipation, thicker aluminum can be used, alternatively finned sheets or liquid cooled structures can be used.

Rigid printed circuit substrate material can include rigid boards made from phenolic, epoxy, epoxy fiberglass, and other conventional rigid circuit board substrates.

The flexible printed circuit boards of the invention are typically made from a flexible metal-film laminate material. The laminate can comprise a polymer film layer having a metal layer on each surface of a film. Both adhesiveless and adhesive containing laminates can be used. Films that can be used for forming the metal film laminates used in the circuit boards of the invention are commonly organic film-forming compositions that can be formed from a variety of common polymeric films including addition polymers, condensation polymers, natural polymers, treated films, thermosetting or thermoplastic resins.

Useful thermosetting resins include phenolic resins, epoxy resins, polyurethane resins, thermosetting polyester resins, silicone resins, etc. Engineering plastics such as polyamide (Nylon), aromatic polyester, polyetherimide, polyether ether ketone, polysulfone, and polyphenylene ether; crosslinkable resins obtained by compounding an organic peroxide as a crosslinking agent and a radical polymerizable polyfunctional compound, a thermosetting resin and the like can be used. Because of the nature of thermosetting resins, they cannot be further heat processed without severe distortion or destruction.

Polyimide film can be used in the preferred film circuit laminate. Preferred polyimides are typically made by a two step reaction involving contacting a tetrabasic acid dianhydride with an aromatic diamine giving first a polyamic acid that is then converted by heat or catalyst into a high molecular weight, linear polyimide. Such polyimides are easily produced as film or sheet.

Thermoplastic resins are also useful in the laminate films of the invention. Useful addition polymers include poly alpha-olefins, polyethylene, polypropylene, poly 4-methylpentene-1, ethylene/vinyl copolymers, ethylene vinyl acetate copolymers, ethylene acrylic acid copolymers, ethylene methacrylate copolymers, ethyl-methylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols, acrylic polymers made from acrylic acid, methacrylic acid, methylacrylate, methacrylate, acrylamide and others. Fluorocarbon resins such as polytetrafluoroethylene, polyvinylidiene fluoride, and fluorinated ethylene-propylene resins. Styrene resins such as a polystyrene, alpha-methylstyrene, high impact polystyrene acrylonitrile-butadiene-styrene polymers and others.

A variety of condensation polymers can also be used in the manufacture of the laminates of the invention including nylon (polyamide) resins such as nylon 6, nylon 66, nylon 10, nylon 11, nylon 12, etc. A variety of polyester materials can be made from dibasic aliphatic and aromatic carboxylic acids and di- or triols. Representative examples include poly(ethylene-co-terephthlate), poly(butylene-co-terephthlate), poly(ethylene-co-naphthalate) and others.

Polycarbonates can also be used in the manufacture of the circuit invention. Such polycarbonates are long chained linear polyesters of carbonic acid and dihydric phenols typically made by reacting phosgene ($COCl_2$) with bisphenol A materials resulting in transparent, tough, dimensionally stable plastics. A variety of other condensation polymers are used including polyetherimide, polysulfone, polyethersulfone, polybenzazoles, aromatic polysulfones, polyphenylene oxides, polyether ether ketone and others.

Preferred material for use in the laminate of the invention are polyester film materials such as polyethyleneterephthlate, polybutylene terephthlate and polyimide materials. These film materials are sold by dupont, Allied-Apical, Teijin, Kanega-fuchi, as Mylar®, Kapton®, Apical®, Upilex®, etc., films.

Metals

The metal useful in forming the metal film laminate of the circuit boards of the invention are often shiny, metallic layers not subject to substantial corrosion from atmospheric conditions and have substantial electrical conductivity. Preferred metals for use in forming the laminate structures of the invention include aluminum, copper, gold, silver, etc.

To make an adhesive metal laminate, a foil can be adhered to a hard board or film substrate with a conventional laminating adhesive.

To make the adhesiveless metal layer, the film can be contacted with a source of a conductive layer. Preferably, a source of metal vapor is used to form a metallized layer on the plasma treated film. Vapor metallization is a low pressure, high temperature (energy) process in which metal vapor is formed. A variety of other layers can be used including carbon, conductive polymers, etc.

The metallization step can be each carried out at relatively low pressure, typically less than 200 Torr. This process can be carried out in a single chamber which is divided into sections operated at a pressure that is optimized for multiple metal addition. Typically, the metallization occurs at pressures less than 0.5 Torr.

The metallized film is particularly suited for the subsequent formation of thick metal layers such as those useful in the end uses discussed above. Such layers can be formed in a variety of techniques, however, electroplating and electroless plating are the most commonly used metal layer formation techniques.

Electroplating is the electrodeposition of an adherent metallic coating on an electrode surface to form a metal deposit. The electrode surface being treated is made the cathode in an electroplating solution or bath. Such baths are typically aqueous solutions from which metal is reduced by the flow of an electric current through a solution of the metal salt. In performing electroplating of metal on a conductive electrode, the electrode or substrate is often cleaned, rinsed, dipped in acid or is subject to other pretreatment or substrate preparation. In operating electroplating techniques, the substrate is immersed into a solution and necessary DC power is applied typically from metallic anodes to the substrate cathode. The solutions are often agitated and the temperature current metal concentration and other variables are closely controlled using well known principles.

In the preparation of metal laminates of the invention, the laminate metal is typically copper plated onto a substrate having a metal layer prepared using the copper metallization techniques. Useful copper layers, can also be formed using electroless plating which is the controlled autocatalytic deposition of a continuous film by the interaction, in a solution of metal salt between a metal and a chemical reducing agent. Electroless deposition can give films of metals, alloys, metallic compounds, and composites on both conductive and non-conductive surfaces. Electroless solutions contain a metal salt, reducing agent, a pH adjuster or buffer, a complexing agent and one or more additives to control solution stability, film properties, deposition rates, etc. Primarily, nickel, copper, gold and silver are plated using electroless techniques. The advantage of electroless plating is the ability to plate metal on non-conductive or poorly conductive surfaces.

Once the adhesive or adhesiveless metal layer(s) is formed, a printed wiring board can be made by forming the circuit pattern in metal on the film. The pattern can be formed by an etching process or by a semi-additive pattern plating process. In an etching process, a resist and basic etchant baths are used to selectively remove copper leaving the pattern. Alternatively, a conductive circuit pattern can be formed on the laminate of the invention using a semi-additive technique. In such a technique, the circuit pattern is formed in a way to significantly reduce the amount of metal removed through an etching step. In the semi-additive technique, after the first metal layer is formed using metallization, a resist is formed on the first layer. The resist leaves revealed, the first metal layer in the pattern of the desired circuit. Onto the revealed pattern is plated a thick, 0.1 to 40 µm layer of copper using commonly electroplating or electroless techniques. After the second metal layer in the desired pattern is complete, the resist can be removed leaving the thick metal pattern and in the areas revealed by the removal of resist, the thin metallized layer. The remaining revealed metallized areas are then removed using a light etch. The metallized layers are thin and require brief etching substantially reducing the amount of metal removed, the amount of etchant consumed and substantially reduces the amounts of waste materials. The technology in Swisher, U.S. Pat. No. 5,112,462 can be used to make the flexible, polymer-metal circuit.

The appropriately patterned double sided printed circuit board is manufactured into a finished circuit by attaching active and passive components to one surface of the board. The opposite surface of the circuit board is attached to the heat sink through the disclosed insulating layer. The active circuits can be attached to the printed circuit board by any fabrication technology. However, a preferred method of attaching the active components involves surface mounting of the active components. The use of surface mount technology in attaching active components to one surface of the double sided printed circuit board of the invention results in a side free of any active component or attachment structures that would interfere in thermal transfer to the heat sink. The noncomponent side of the circuit board comprises a flat surface having only circuit patterns, ground plane, logos or other etched patterns overlying the flexible film material. As such, the flat surface is ideal for attachment through the adhesive coated layer to the heat sink. The flat surface is thermally connected to the heat sink over the entire surface. No gaps arise due to active component or attachment structure interference. Such a structure maximizes thermal conductivity.

Different processing techniques may be used to bond the surface mount components to the footprints of bonding pads formed in the circuit board. For example, for bonding flip chips (i.e., unpackaged integrated circuit chips having solder bumps formed on one side thereof), one preferred direct chip attachment mechanism in U.S. Pat. No. 5,261,593, issued to Casson et al. According to the Casson et al. process, a low temperature solder paste is registered on contact pads on the overlay. One or more flip chips are registered on the overlay with the solder bumps on the chips centered on the solder paste on the contact pads. The solder paste is then reflowed by heating the entire assembly as a whole in an infrared reflow oven or other heat applying mechanism. The solder bumps and solder paste then form homogenous compositions which solidify to provide a mechanical and electrical interconnection between the flip chips and the circuit board. Many other direct chip attachment techniques, such as tape automated bonding (tab), wire lead bonding C4, etc. may be used in the alternative, and that different materials, such as solders, solder pastes, conductive adhesives, etc. may be used to bond solder bumps or leads of the surface mount components to the circuit board.

Surface mount technology or assembly of flexible circuits are well matched. Components using surface assembly can take a wide variety of package sizes and package types. Typical components include resistors, capacitors, inductors, integrated circuits, diodes, transistors, resistor arrays and others. A variety of integrated circuit packaging can be used including chip carriers, dual in line packages, solder bump technology, direct wire interconnections and others can be used. Conventional soldering techniques can be used including IR reflow, heat probe, wave soldering and other techniques.

The resulting circuits, with attached heat sinks, of the invention can be used in a variety of applications where thermal control is important including radio frequency circuits, power circuits, high frequency circuits, circuits exposed to increased temperatures, etc. One preferred application for the technology of this invention is in automotive applications. Such automotive applications can include engine controllers, automatic breaking system controllers, pollution control modules, automotive radios, etc. or any other useful automotive application that can be mounted in the engine compartment, near exhaust systems, or in the vicinity of heated braking elements.

DETAILED DESCRIPTION OF THE FIGURE

The heat sink 10 comes into contact with the adhesive layer 21 as the unfilled polymeric film layer 20, having an adhesive layer 21 on the opposite side of the polymeric layer 20. The flexible printed circuit board layer 30 having circuit traces 31 on one side of the flexible layer and circuit element 32 on the opposite side of the layer is adhered to the adhesive 21 on the insulating layer 20. Insulating layer 20 prevents conduction of electricity from circuit portion 32 to heat sink 11. The insulating layer covers all active portions of the circuit pattern 32. The surface of the printed circuit board 30 that does not contact the insulating layer can be coated with a solder resist or other resist coating. The printed circuit board can be of any design and can have virtually any circuit pattern including surface contact pads, edge connectors or mounting locations for passive devices, resistors, capacitors, inductors or active components such as diodes, transistors, integrated circuits or power devices such as power transistors, SCR's, triacs, and other rectifiers, inverters, transformers, inductors, capacitors, resistors and others. The printed circuit board can extend past the edge of the aluminum heat sink if desired. However, any portions of the printed circuit board having substantial heat generation should come in contact with the heat sink. In the FIGURE, the ground plane 33 of the reverse side of the printed circuit board 30 extends past the edge of the aluminum heat sink at 33.

The following examples and data illustrate specific embodiments of the invention. The examples and data contain information regarding the structures and manufacturing techniques of the adhesive coated insulating film of the invention and to the assemblies comprising a printed circuit board, a heat sink and the intermediate adhesive film. Further, the thermal and electrical properties of the assembly and test methods for measurement are recited. The following contains a best mode:

TABLE I

| Sample | Description | Thermal Impedance °C.-mm²/watt* | Dielectric Strength KV ac. ASTM-D-149 |
|---|---|---|---|
| 1 | 6 μm PEN 2 × 45 μm Bergquist PSA** | 150 | 3.1 |
| 2 | 12 μm PEN 2 × 45 μm Bergquist PSA | 190 | 6.1 |
| 3 | 6 μm PEN 2 × 35 μm Sheldahl 713-51*** | 100 | 5.8 |
| 4 | 12 μm PEN 2 × 35 μm Sheldahl 713-51 | 140 | 7.3 |
| 5 | 5 μm PEI 2 × 35 μm Sheldahl 713-51 | 80 | 2.4 |
| 6 | 8 μm PEI 2 × 35 μm Sheldahl 713-51 | 95 | 5.7 |
| 7 | 14 μm PEI 2 × 35 μm Sheldahl 713-51 | 125 | 6.4 |

*Theoretical impedance.
**Has a k of 0.9 watts/m-K.
***Has a k of 1.0 to 2.0 watts/m-K.

In these constructions the Bergquist PSA is a filled acrylic with a thermal conductivity of 0.9 watts/m-K while the Sheldahl adhesive 713-51 is a filled thermoplastic/thermoset with a thermal conductivity of between 1.0 and 2.0 watts/m-K.

The foregoing specification examples, data, drawings and discussion illustrate embodiments of the invention that has been developed. A variety of embodiments of the invention can be made without departing from the spirit or scope of the invention. The invention resides in the claims hereinafter appended.

We claim:

1. An assembly comprising an electronic circuit electrically insulated from, but in thermal communication with, a heat sink, the assembly comprising:
   (a) a heat sink;
   (b) an electronic circuit, comprising at least one substrate layer and a metallic circuit trace, that produces heat as a result of operation; and
   (c) an insulating layer disposed between the electronic circuit and the heat sink, the insulating layer having a maximum thermal impedance of 250° C.-mm²/watt and a minimum dielectric strength of 400 volts (ac), the insulating layer comprising:
      (i) a first thermally conducting adhesive layer having a thickness less than 60μ, in contact with the heat sink, comprising an adhesive and about 10 to 50% by volume of a thermally conductive solid particulate;
      (ii) an unfilled polymeric film layer having a maximum thickness less than 15μ; and
      (iii) a second thermally conducting adhesive layer having a thickness less than 60μ, in contact with the electronic circuit, comprising an adhesive and about 10 to 50% by volume of a thermally conductive, electrically insulating solid particulate;
   wherein the substrate layer and insulating layer have a combined maximum thickness of about 5 mm.

2. The assembly of claim 1 wherein the electronic circuit comprises two or more layers of substrate each supporting at least one circuit trace.

3. The assembly of claim 1 wherein the unfilled polymeric film layer comprises a polyester or a polyimide.

4. The assembly of claim 3 wherein the unfilled polymeric film layer comprises a polyethylene naphthalate.

5. The assembly of claim 3 wherein the unfilled polymeric film layer comprises a polyethylene terephthalate.

6. The assembly of claim 3 wherein the unfilled polymeric film layer comprises a polyetherimide or a polyimide.

7. The assembly of claim 1 wherein the unfilled polymeric film layer comprises a polyether ether ketone or a polyphenylene sulfide.

8. The assembly of claim 1 wherein at least one of the first or second thermally conducting adhesive layers comprises an epoxy adhesive.

9. The assembly of claim 1 wherein at least one of the first or second thermally conducting adhesive layers comprises an acrylic adhesive.

10. The assembly of claim 1 wherein the thermally conductive solid particulate within at least one of the first and second adhesive layers comprises a thermally conductive ceramic material.

11. The assembly of claim 10 wherein the thermally conductive ceramic material is independently selected from the group consisting of aluminum oxide, beryllium oxide, magnesium oxide, titanium oxide, zinc oxide, boron nitride, aluminum nitride, silicon nitride, silicon carbide, silica, diamond, zirconium oxide, zinc oxide, tin oxide, copper oxide, antimony oxide, and mixtures thereof.

12. The assembly of claim 1 wherein the thermally conductive solid particulate within the first adhesive layer adjacent to the heat sink is Cu, Al, Ag, Au, Ni, Zn, Fe, Pd, Pb, Sn, solder, graphite, carbon or mixtures thereof.

13. The assembly of claim 1 wherein the dielectric strength of the unfilled polymeric film layer is greater than about 300 v (ac).

14. The assembly of claim 1 wherein the thermal conductivity of the first adhesive layer is greater than about 0.5 watt/m-K.

15. The assembly of claim 1 wherein the thermal conductivity of the second adhesive layer is greater than about 0.5 watt/m-K.

16. The assembly of claim 1 wherein the thermal impedance of the insulating layer is less than about 100° C.-mm²/watt.

17. The assembly of claim 1 wherein the electronic circuit comprises surface mounted active or passive components.

18. The assembly of claim 1 wherein the electronic circuit has at least one circuit trace on each side and plated through holes.

19. The assembly of claim 1 wherein the electronic circuit additionally comprises a metallic circuit trace providing a thermal passageway.

20. The assembly of claim 19 wherein the thermal passageway comprises a metallized via providing a thermal passageway through the substrate layer.

21. An assembly comprising an electronic circuit electrically insulated from, but in thermal communication with, a heat sink, the assembly comprising:
   (a) a heat sink comprising an aluminum sheet;
   (b) an electronic circuit, comprising a polymeric film substrate having at least one copper circuit trace on opposite sides of the film and at least one surface mounted component, that produces heat as a result of operation; and
   (c) an insulating layer disposed between the electronic circuit and the heat sink, the insulating layer having a maximum thermal impedance of 250° C.-mm²/watt and a minimum dielectric strength of 400 volts (ac), the layer comprising:
      (i) a first thermally conducting adhesive layer having a thickness less than 60μ, in contact with the heat sink, comprising an adhesive and about 10 to 50% by volume of a thermally conductive solid particulate;
      (ii) an unfilled poly(ethylene-co-naphthalate) film layer having a maximum thickness less than 15 μm; and
      (iii) a second thermally conducting adhesive layer having a thickness less than 60μ, in contact with the electronic circuit, comprising an adhesive and about 10 to 50% by volume of a thermally conducting, solid particulate;
   wherein the substrate layer and insulating layer have a combined maximum thickness of about 5 mm.

22. The assembly of claim 1 wherein the unfilled poly(ethylene-co-naphthalate) film layer comprises a poly(ethylene-co-2,6-naphthalene dicarboxylate) film.

23. The assembly of claim 21 wherein at least one of the first or second thermally conducting adhesive layers comprises an epoxy adhesive.

24. The assembly of claim 21 wherein at least one of the first or second thermally conducting adhesive layers comprises an acrylic adhesive.

25. The assembly of claim 21 wherein the thermally conductive solid particulate within at least one of the first and second adhesive layers comprises a thermally conductive ceramic material.

26. The assembly of claim 25 wherein the thermally conductive ceramic material is independently selected from the group consisting of aluminum oxide, beryllium oxide, magnesium oxide, titanium oxide, zinc oxide, boron nitride, aluminum nitride, silicon nitride, silicon carbide, silica, diamond, zirconium oxide, zinc oxide, tin oxide, copper oxide, antimony oxide, and mixtures thereof.

27. The assembly of claim 21 wherein the thermally conductive solid particulate within the first adhesive layer adjacent to the heat sink is Cu, Al, Ag, Au, Ni, Zn, Fe, Pd, Pb, Sn, solder, graphite, carbon, or mixtures thereof.

28. The assembly of claim 21 wherein the dielectric strength of the unfilled poly(ethylene-co-naphthalate) film layer is about 300 v (ac).

29. The assembly of claim 21 wherein the thermal conductivity of the first adhesive layer is greater than about 0.5 watts/m-K.

30. The assembly of claim 21 wherein the thermal conductivity of the second adhesive layer is greater than about 0.5 watts/m-K.

31. The assembly of claim 21 wherein the overall thermal impedance of the insulating layer is less than about 100° C.-mm²/watt.

32. The assembly of claim 21 wherein the electronic circuit comprises surface mounted active or passive components.

33. The assembly of claim 21 wherein the electronic circuit has plated through holes.

34. The assembly of claim 21 wherein the electronic circuit additionally comprises a metallic circuit trace providing a thermal passageway.

35. The assembly of claim 34 wherein the thermal passageway comprises a metallized via providing a thermal passageway through the polymeric film substrate.

36. An assembly comprising an electronic circuit electrically insulated from, but in thermal communication with, a heat sink, the assembly comprising:

(a) a heat sink;

(b) an electronic circuit, comprising at least one substrate layer and a metallic circuit trace, that produces heat as a result of operation; and c) an insulating layer disposed between the electronic circuit and the heat sink, the insulating layer having a thermal impedance less than about 100° C.-mm²/watt and a dielectric strength of at least 400 volts (ac) to act as a thermal conductor and an electrical insulator, the layer comprising:

(i) a first thermally conducting adhesive layer having a thermal conductivity of greater than 0.5 watt/m-K and comprising an adhesive and about 10 to 50% by volume of a thermally conductive solid particulate;

(ii) an unfilled poly(ethylene-co-naphthalate) polyester film layer; and (iii) a second thermally conducting adhesive layer, having a thermal conductivity greater than about 0.5 watt/m-K, comprising an adhesive and about 10 to 50% by volume of a thermally conductive, electrically insulating solid particulate.

37. The assembly of claim 36 wherein the electronic circuit comprises two or more layers of substrate each supporting at least one circuit trace.

38. The assembly of claim 36 wherein at least one of the first or second thermally conducting adhesive layers comprises an epoxy adhesive.

39. The assembly of claim 36 wherein at least one of the first or second thermally conducting adhesive layers comprises an acrylic adhesive.

40. The assembly of claim 36 wherein the thermally conductive solid particulate within at least one of the first and second adhesive layers comprises a thermally conductive ceramic material.

41. The assembly of claim 40 wherein the thermally conductive ceramic material is independently selected from the group consisting of aluminum oxide, beryllium oxide, magnesium oxide, titanium oxide, zinc oxide, boron nitride, aluminum nitride, silicon nitride, silicon carbide, silica, diamond, zirconium oxide, zinc oxide, tin oxide, copper oxide, antimony oxide, and mixtures thereof.

42. The assembly of claim 36 wherein the thermally conductive solid particulate within the first adhesive layer is adjacent to a heat sink and is Cu, Al, Ag, Au, Ni, Zn, Fe, Pd, Pb, Sn, solder, graphite, carbon or mixtures thereof.

43. The assembly of claim 36 wherein the electronic circuit comprises surface mounted active or passive components.

44. The assembly of claim 36 wherein the electronic circuit has at least one circuit trace on each side and plated through holes.

45. The assembly of claim 36 wherein the electronic circuit additionally comprises a metallic circuit trace providing a thermal passageway.

46. The assembly of claim 45 wherein the thermal passageway comprises a metallized via providing a thermal passageway through the substrate layer.

47. The assembly of claim 36 wherein the substrate layer and insulating layer have a combined maximum thickness of about 5 mm.

* * * * *